(12) United States Patent
Choi et al.

(10) Patent No.: US 12,348,233 B2
(45) Date of Patent: Jul. 1, 2025

(54) FREQUENCY MULTIPLIER FOR PHASE ROTATION

(71) Applicant: SAMSUNG ELECTRONICS CO., LTD., Suwon-si (KR)

(72) Inventors: Wooseok Choi, Seoul (KR); Joonghyun Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/480,817

(22) Filed: Oct. 4, 2023

(65) Prior Publication Data

US 2024/0146312 A1 May 2, 2024

(30) Foreign Application Priority Data

Oct. 31, 2022 (KR) .......................... 10-2022-0143026
Jan. 9, 2023 (KR) .......................... 10-2023-0003033

(51) Int. Cl.
*H03L 7/081* (2006.01)
*H03K 5/00* (2006.01)

(52) U.S. Cl.
CPC ....... *H03L 7/0812* (2013.01); *H03K 5/00006* (2013.01); *H03K 2005/00019* (2013.01)

(58) Field of Classification Search
CPC ... H03L 7/0814; H03L 7/0812; H03L 7/0816; H03L 7/0818; H03L 7/081; H03L 7/091; H03L 7/07; H03L 7/0805; H03L 7/085; H03L 7/24; H03L 7/089; H03L 7/087; H03L 7/0992; H03L 7/16; H03L 7/095; H03L 7/0995; H03L 7/0891; H03L 7/1976; H03L 2207/50; H03L 7/093; H03L 7/0802; H03K 5/135; H03K 5/00006; H04L 7/0025; H04L 7/033
See application file for complete search history.

(56) References Cited

U.S. PATENT DOCUMENTS

| | | | |
|---|---|---|---|
| 6,952,431 B1 | 10/2005 | Dally et al. | |
| 7,593,496 B2 | 9/2009 | Fan et al. | |
| 7,636,002 B2 | 12/2009 | Kim | |
| 9,306,585 B1 * | 4/2016 | Elkholy | ................ H03L 7/0814 |
| 9,306,730 B1 | 4/2016 | Shu et al. | |
| 9,614,537 B1 * | 4/2017 | Nandwana | ................ H03L 7/24 |
| 10,110,239 B1 * | 10/2018 | Shu | ................ H03K 5/1565 |
| 10,250,264 B2 | 4/2019 | Wang et al. | |

(Continued)

FOREIGN PATENT DOCUMENTS

| KR | 10-0824791 | 2/2008 |
|---|---|---|
| KR | 10-2008-0022451 | 3/2008 |

*Primary Examiner* — John W Poos
(74) *Attorney, Agent, or Firm* — MORGAN, LEWIS & BOCKIUS LLP

(57) ABSTRACT

A frequency multiplier includes a first digitally controlled delay line (DCDL) configured to receive a first clock signal and generate a second clock signal by changing a phase of the first clock signal, a multiplying delay-locked loop (MDLL) configured to generate a third clock signal by multiplying a frequency of the second clock signal, and a DCDL calibration circuit configured to receive the second clock signal and generate a gain signal for adjusting a gain of the first DCDL where a difference between a maximum delay and a minimum delay of the first DCDL is substantially equal to a period of the third clock signal.

20 Claims, 14 Drawing Sheets

(56) References Cited

U.S. PATENT DOCUMENTS

| | | |
|---|---|---|
| 10,374,617 B2 | 8/2019 | Kuan et al. |
| 10,693,472 B2 | 6/2020 | Kim et al. |
| 11,342,923 B1 | 5/2022 | Van Den Heuvel et al. |
| 2017/0026048 A1* | 1/2017 | Huang ..................... H03L 7/24 |

* cited by examiner

FREQUENCY MULTIPLIER FOR PHASE ROTATION

CROSS-REFERENCE TO RELATED APPLICATION

This application claims priority under 35 U.S.C. § 119 to Korean Patent Application No. 10-2022-0143026, filed on Oct. 31, 2022 in the Korean Intellectual Property Office, and Korean Patent Application No. 10-2023-0003033, filed on Jan. 9, 2023 in the Korean Intellectual Property Office, the disclosures of which are incorporated by reference herein in their entireties.

FIELD

The presently disclosed inventive concept relates to an electronic device, and more particularly to a frequency multiplier for phase rotation.

DISCUSSION

Phase interpolators (PI) may use, as an input signal, a multi-phase clock signal having substantially the same frequency as the frequency of a clock signal to be output. Therefore, when it is intended to output a clock signal having a high frequency, a multi-phase clock signal having substantially the same frequency as the frequency of the output signal may have to be generated outside a PI and then be transmitted to the PI. In addition, a process of generating multi-phase clock signals having a high frequency and distributing the multi-phase clock signals may consume a relatively large amount of power and/or a relatively large area of hardware. In addition, a relatively large amount of power may be consumed to correct the linearity of such PIs.

Therefore, it may be desirable to use a phase rotator or frequency multiplier that is suitable for high-speed communications and input/output (I/O) interfaces, consumes a relatively small amount of power, and is capable of high performance.

SUMMARY

The presently disclosed inventive concept provides a frequency multiplier for phase rotation.

Embodiments of the inventive concept are not limited to the aforesaid, but these and other embodiments may be more clearly understood by those of ordinary skill in the pertinent art based on the descriptions that follow.

According to an embodiment of the inventive concept, there is provided a frequency multiplier. The frequency multiplier includes: a first digitally controlled delay line (DCDL) configured to receive a first clock signal and generate a second clock signal by changing a phase of the first clock signal; a multiplying delay-locked loop (MDLL) configured to receive the second clock signal and generate a third clock signal by multiplying a frequency of the second clock signal; and a DCDL calibration circuit configured to receive the second clock signal and generate a gain signal for adjusting a gain of the first DCDL, wherein a difference between a maximum delay and a minimum delay of the first DCDL is substantially equal to a period of the third clock signal.

According to an embodiment of the inventive concept, there is provided a frequency multiplier. The frequency multiplier includes a first digitally controlled delay line (DCDL), a multiplying delay-locked loop (MDLL) connected to an output terminal of the first DCDL, a second DCDL connected to the output terminal of the first DCDL, a third DCDL connected to an output terminal of the second DCDL, a bang-bang phase detector (BBPD) connected to an output terminal of the MDLL and an output terminal of the third DCDL, and a gain controller connected to an output terminal of the BBPD, the second DCDL, and the third DCDL, and configured to control a gain of the first DCDL.

According to an embodiment of the inventive concept, there is provided a frequency multiplier. The frequency multiplier includes a first digitally controlled delay line (DCDL) configured to receive a first clock signal and generate a second clock signal by varying a phase of the first clock signal based on a digital control word (DCW) signal, a multiplying delay-locked loop (MDLL) configured to generate a third clock signal by multiplying a frequency of the second clock signal based on the DCW signal, a DCDL calibration circuit configured to generate a gain signal for varying a gain of the first DCDL wherein a difference between a maximum delay and a minimum delay of the first DCDL is substantially equal to a period of the third clock signal, a controller configured to generate a logic signal for controlling a delay of the first DCDL and a frequency multiplication ratio of the MDLL, and a multiplier configured to generate the DCW signal by multiplying the gain signal and the logic signal.

BRIEF DESCRIPTION OF THE DRAWINGS

Embodiments of the present disclosure may be more clearly understood from the following detailed description when taken in conjunction with the accompanying drawings, in which.

DETAILED DESCRIPTION

Hereinafter, non-limiting illustrative embodiments of the present disclosure may be described by way of example with reference to the accompanying drawings.

Figure 1:
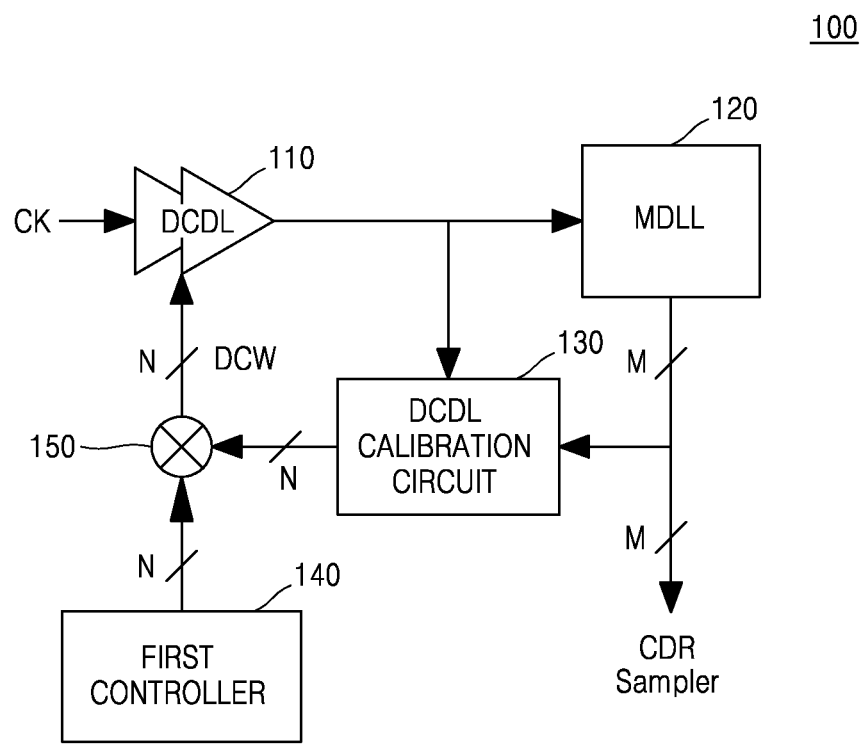
FIG. 1 is a block diagram illustrating a frequency multiplier according to an embodiment.

FIG. 1 illustrates a frequency multiplier 100 according to an embodiment.

Referring to FIG. 1, the frequency multiplier 100 of this embodiment may include a digitally controlled delay line (DCDL) 110, a multiplying delay-locked loop (MDLL) 120, a DCDL calibration circuit 130, a first controller 140, and a multiplier 150.

The DCDL 110 may be configured to change the phase of an input clock signal CK. For example, the DCDL 110 may be configured to control a delay between the input clock signal CK and an output clock signal, based on a digital control word (DCW) signal. For example, when a clock signal CK having a constant frequency is input, the DCDL 110 may increase or decrease the phase of an output clock signal by increasing or decreasing the delay of the input clock signal CK. In other words, the DCDL 110 may perform a phase shift function for the input clock signal CK. However, because there are maximum and minimum values of delay that may be controlled by the DCDL 110, it may be challenging to implement infinite phase shift using the DCDL 110. However, the frequency multiplier 100 of this embodiment may implement infinite phase shift because the frequency multiplier 100 includes the DCDL 110 and the MDLL 120. Infinite phase shift may be further described infra.

The MDLL 120 may be configured to receive an output clock signal of the DCDL 110 and may multiply the frequency of the received clock signal. In this case, a rising edge of an output clock signal of the MDLL 120 may coincide with a rising edge of an input clock signal of the MDLL 120. Therefore, when the phase of an input clock signal of the MDLL 120 increases, the phase of an output click signal of the MDLL 120 may also increase in the same direction, and when the phase of the input clock signal of MDLL 120 decreases, the phase of the output clock signal of the 120 MDLL may also decrease in the same direction. The MDLL 120 may also be configured to generate multi-phase clock signals. For example, as shown in FIG. 1, the MDLL 120 may be configured to generate clock signals having M phases, but is not limited thereto. Because the MDLL 120 is capable of generating multi-phase clock signals, additional power consumption and additional hardware need not be supported even when a plurality of clock phases are used.

The DCDL calibration circuit 130 may be configured to receive an output clock signal of the DCDL 110 and control the gain of the DCDL 110. The difference between maximum and minimum delay values of the DCDL 110 may coincide with the period of an output clock signal of the MDLL 120 to implement infinite phase shift. The DCDL calibration circuit 130 may calibrate the gain of the DCDL 110 where the difference between the maximum and minimum delay values of the DCDL 110 may coincide with the period of the output clock signal of the MDLL 120. A description may be provided of how the DCDL calibration circuit 130 calibrates the gain of the DCDL 110.

The first controller 140 may be configured to control the delay of the DCDL 110 and the frequency multiplication ratio of the MDLL 120. For example, the first controller 140 may perform control to gradually decrease the delay of the DCDL 110, and when the delay of the DCDL 110 reaches a maximum delay of the DCDL 110, the first controller 140 may vary the delay of the DCDL 110 to a minimum delay of the DCDL 110. In addition, the first controller 140 may decrease the frequency multiplication ratio of the MDLL 120, such as decrementing by 1 without limitation thereto, when the delay of the DCDL 110 reaches the maximum delay. In addition, the first controller 140 may perform control to gradually increase the delay of the DCDL 110, and when the delay of the DCDL 110 reaches the minimum delay of the DCDL 110, the first controller 140 may vary the delay of the DCDL 110 to the maximum delay of the DCDL 110. In addition, the first controller 140 may increase the frequency multiplication ratio of the MDLL 120, such as incrementing by 1 without limitation thereto, when the delay of the DCDL 110 reaches the minimum delay of the DCDL 110. However, the operations described above are merely examples of operations of the first controller 140, and the operations of the first controller 140 are not limited thereto. Operations of the first controller 140 are further described later.

It shall be understood that the increment and/or decrement values are not limited to exactly one (1). For example, either or both may be some other proportion or scaled divisor of the difference between the maximum and minimum delay values, without limitation thereto.

The multiplier 150 may be configured to multiply together an output signal of the DCDL calibration circuit 130 and an output signal of the first controller 140. In addition, the multiplier 150 may transmit results of the multiplication to the DCDL 110, and a signal transmitted from the multiplier 150 to the DCDL 110 may be used as a DCW signal of the DCDL 110. For example, the DCDL calibration circuit 130 may transmit, to the multiplier 150, an N-bit gain control signal for controlling the gain of the DCDL 110. In addition, the first controller 140 may transmit, to the multiplier 150, an N-bit logic signal for controlling the delay of the DCDL 110 or the frequency multiplication ratio of the MDLL 120. The multiplier 150 may multiply the N-bit gain control signal and the N-bit logic signal together, and transmit the most significant bit (MSB) (for example, N bit) of the multiplication result to the DCDL 110. The MSB transmitted to the DCDL 110 may be used as a DCW signal of the DCDL 110. For example, the frequency multiplier 100 may control the delay and gain of the DCDL 110 and the frequency multiplication ratio of the MDLL 120 based on the DCW signal.

The frequency multiplier 100 may be used in connection with a clock and data recovery (CDR) circuit. For example, assuming that the frequency multiplier 100 is connected with a CDR circuit, an output signal of the MDLL 120 may be a CDR sampler. In addition, instead of the first controller 140, a controller included in a CDR circuit may be connected to the multiplier 150, and a CDR logic signal may be input to the multiplier 150. For example, the multiplier 150 may transmit, to the DCDL 110, the MSB of a result of multiplication of a value of a digital loop filter of the CDR circuit and an output signal of the DCDL calibration circuit 130, and the DCDL 110 may use a signal received from the multiplier 150 as a DCW signal.

Figure 2:
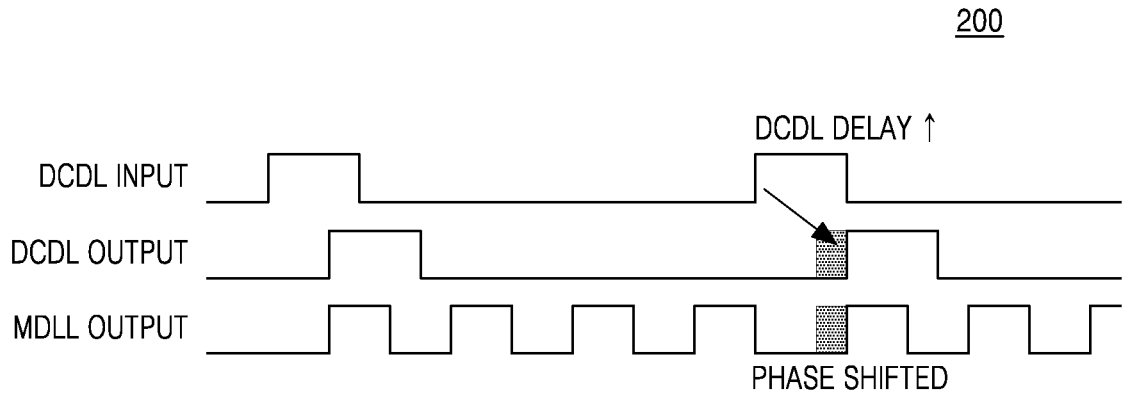
FIG. 2 is a timing diagram illustrating operations of a frequency multiplier according to an embodiment.

FIG. 2 illustrates signal timing operations 200 of the frequency multiplier 100 according to an embodiment. A description may now be provided with reference to FIGS. 2 and 1.

Referring to FIGS. 1 and 2, the DCDL 110 may increase or decrease the phase of an output clock signal by increasing or decreasing the delay of an input clock signal CK. For example, as shown in FIG. 2, the DCDL 110 may increase the phase of the output clock signal by increasing the delay of the input clock signal CK.

In addition, the output clock signal of the DCDL 110 may be transmitted to the MDLL 120, and the MDLL 120 may multiply the frequency of the received signal. In addition, because the MDLL 120 is configured to adjust a rising edge of an input clock signal and a rising edge of an output signal to coincide with each other, the phase of the output clock signal of the DCDL 110 and the phase of the output clock signal of the MDLL 120 may coincide with each other, without limitation thereto.

Figure 3:
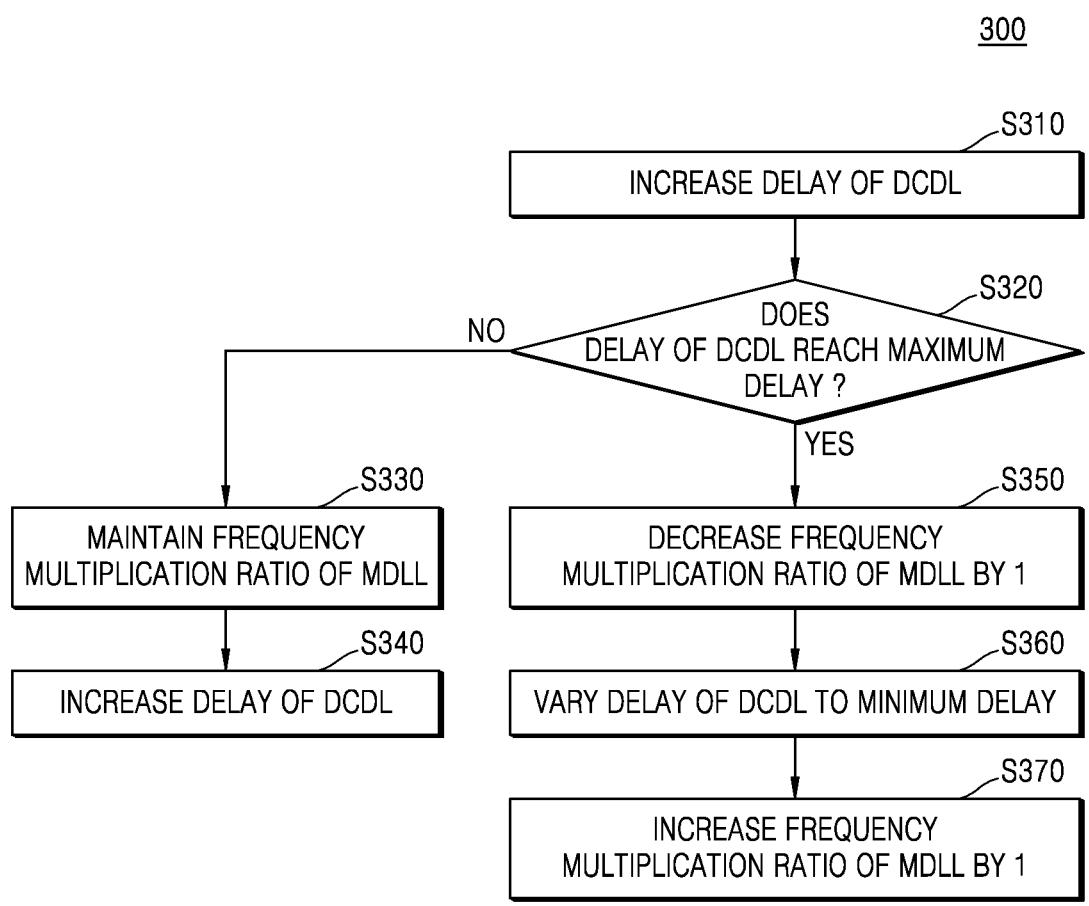
FIG. 3 is a flowchart diagram illustrating operations of a frequency multiplier according to an embodiment.

FIG. 3 illustrates method step operations 300 of the frequency multiplier 100 according to an embodiment. A description may now be provided with reference to FIGS. 1 and 3.

Referring to FIGS. 1 and 3, the frequency multiplier 100 may perform operations for infinite phase shift in one direction.

For example, in operation S310, the first controller 140 may increase the delay of the DCDL 110 to increase the phase of an output clock signal of the MDLL 120.

While the first controller 140 increases the delay of the DCDL 110, the first controller 140 may determine, in operation S320, whether the delay of the DCDL 110 reaches a maximum delay.

When the delay of the DCDL 110 does not reach the maximum delay, the first controller 140 may maintain the frequency multiplication ratio of the MDLL 120 in operation S330.

Moreover, in operation S340, the first controller 140 may continue to increase the delay of the DCDL 110.

When the delay of the DCDL 110 increases and reaches the maximum delay, the first controller 140 may decrease the frequency multiplication ratio of the MDLL 120 in operation S350, such as decrementing by 1 without limitation thereto.

Moreover, in operation S360, the first controller 140 may change the delay of the DCDL 110 from the maximum delay to a minimum delay. After the delay of the DCDL 110 is changed from the maximum delay to the minimum delay, the period of the output clock signal of the DCDL 110 may be less than the period of an input clock signal CK of the DCDL 110 by a value, which value is a difference between a maximum delay of DCDL 110 and a minimum delay of DCDL 110. Therefore, when a value, which value is a difference between a maximum delay of DCDL 110 and a minimum delay of DCDL 110, is substantially equal to one period of the output clock signal of the MDLL 120 and the delay of the DCDL 110 is changed from the maximum delay to the minimum delay, the period of the output clock signal of the DCDL 110 may be less than the period of the input clock signal CK of the DCDL 110 by the period of the output clock signal of the MDLL 120. Therefore, when a value, which value is a difference between a maximum delay of DCDL 110 and a minimum delay of DCDL 110, is substantially equal to one period of the output clock signal of the MDLL 120 and the delay of the DCDL 110 reaches the maximum delay, the frequency multiplication ratio of the MDLL 120 may be reduced, such as decrementing by 1 without limitation thereto, and the delay of the DCDL 110 may be changed from the maximum delay to the minimum delay where the MDLL 120 may output a clock signal having the same period as before without error.

In operation S370, the first controller 140 may again increase the frequency multiplication ratio of the MDLL 120, such as incrementing by 1 without limitation thereto.

In addition, because the delay of the DCDL 110 is changed from the maximum delay to the minimum delay, the delay of the DCDL 110 may be increased again to the maximum delay, and thus, the phase of the output clock signal of the MDLL 120 may continue to increase. In addition, when the delay of the DCDL 110 reaches the maximum delay again, the first controller 140 may repeat the operations described above. Therefore, the frequency multiplier 100 may realize infinite phase shift in one direction even when the delay of the DCDL 110 have maximum and minimum values.

Figure 4:
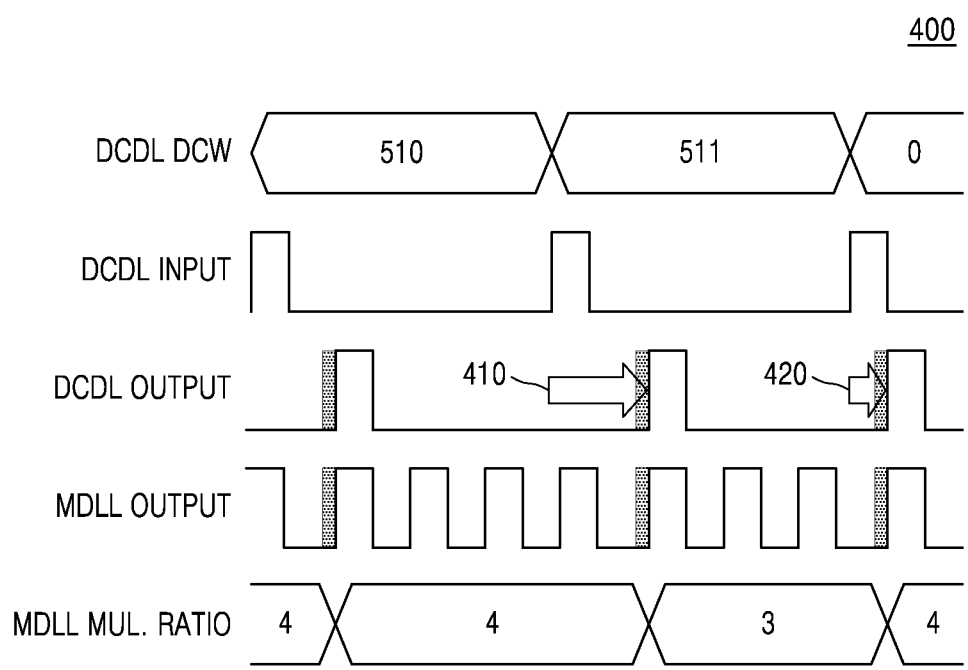
FIG. 4 is a timing diagram illustrating operations of a frequency multiplier according to an embodiment.

FIG. 4 illustrates signal timing operations 400 of the frequency multiplier 100 according to an embodiment. A description may now be provided with reference to FIGS. 4 and 1.

A DCDL DCW signal may be a signal corresponding to the MSB of a result of multiplication of an output signal of the DCDL calibration circuit 130 and an output signal of the first controller 140.

Referring to FIGS. 4 and 1, the DCDL 110 may determine the delay of the DCDL 110 based on the DCDL DCW signal. For example, as the value of the DCDL DCW signal increases, the delay of the DCDL 110 may also increase, and as the value of the DCDL DCW signal decreases, the delay of the DCDL 110 may also decrease. In addition, assuming that the value of the DCDL DCW signal may range from 0 to 511, assuming that a DCW signal has 9 bits without limitation thereto, the delay of the DCDL 110 may have a maximum delay 410 when the value of the DCDL DCW signal is 511. In addition, when the value of the DCDL DCW signal is 0, the delay of the DCDL 110 may have a minimum delay 420.

The frequency multiplier 100 may perform operations for infinite phase shift in one direction. For example, when the value of the DCDL DCW signal reaches the maximum value of 511 while the value of the DCDL DCW signal is increased to increase the phase of an output signal of the MDLL 120, the frequency multiplication ratio of the MDLL 120 may be reduced, such as decrementing by 1 without limitation thereto. For example, when the value of the DCDL DCW signal reaches 511 while the frequency multiplication ratio of the MDLL 120 is maintained at 4, the frequency multiplication ratio of the MDLL 120 may be changed to 3. In addition, when the value of the DCDL DCW signal reaches the maximum value of 511, the first controller 140 may change the value of the DCDL DCW signal to the minimum value of 0. Therefore, the delay of the DCDL 110 may be changed from the maximum delay 410 to the minimum delay 420. Therefore, when the delay of the DCDL 110 is changed from the maximum delay 410 to the minimum delay 420, the period of an output clock signal of the DCDL 110 may be shorter than the period of an input clock signal CK of the DCDL 110 by a value, which value is a difference between a maximum delay 410 of DCDL 110 and a minimum delay 420 of DCDL 110. Therefore, when a value, which value is a difference between a maximum delay 410 of DCDL 110 and a minimum delay 420 of DCDL 110, is substantially equal to one period of an output clock signal of MDLL 120 and the delay of DCDL 110 is changed from the maximum delay 410 to the minimum delay 420, the period of the output clock signal of the DCDL 110 may be shorter than the period of the input clock signal CK of the DCDL 110 by one period of an output clock signal of the MDLL 120. Therefore, when a value, which value is a difference between a maximum delay 410 of DCDL 110 and a minimum delay 420 of DCDL 110, is substantially equal to one period of the output clock signal of MDLL 120 and the delay of the DCDL 110 reaches the maximum delay 410, the frequency multiplication ratio of the MDLL 120 may be decreased, such as decrementing by 1 without limitation thereto, and the delay of the DCDL 110 may be changed from the maximum delay 410 to the minimum delay 420, thereby allowing the MDLL 120 to output a clock signal having the same period as before without error as shown in FIG. 4.

Figure 5:
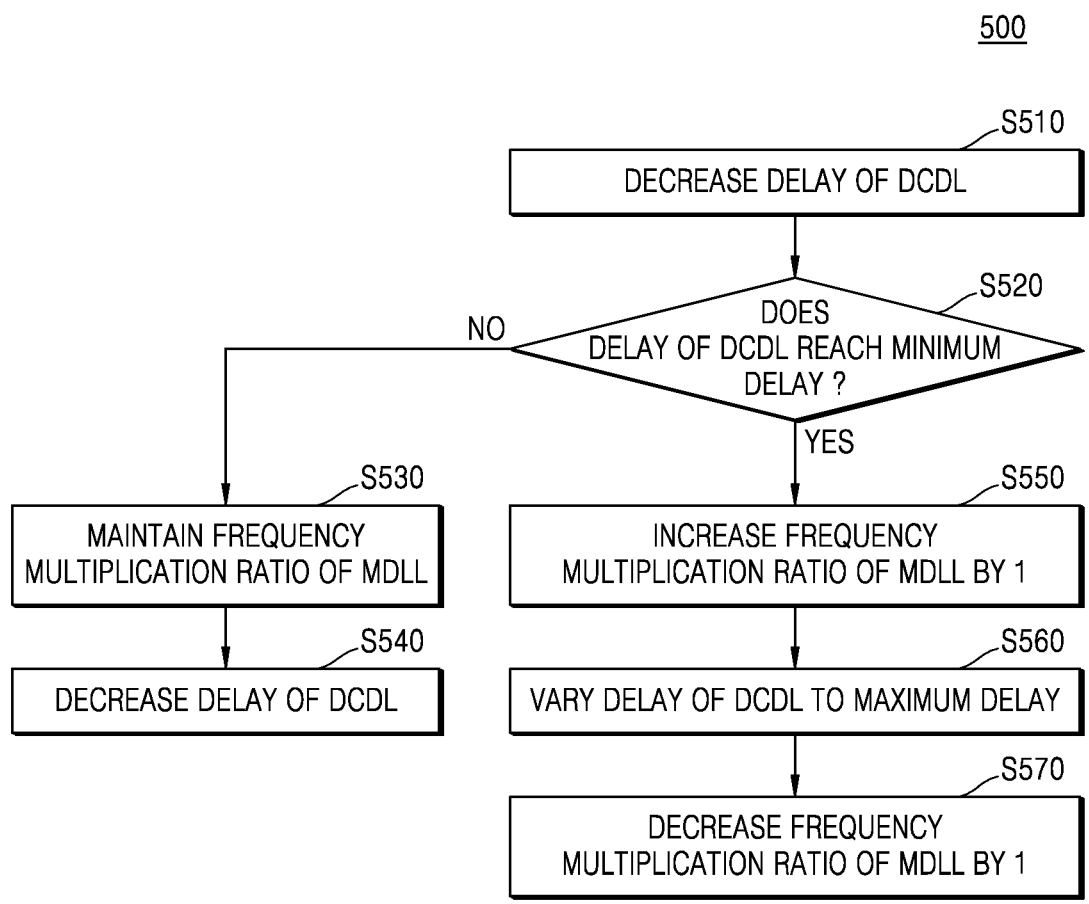
FIG. 5 is a flowchart diagram illustrating operations of a frequency multiplier according to an embodiment.

FIG. 5 illustrates method step operations 500 of the frequency multiplier 100 according to an embodiment. A description may now be provided with reference to FIGS. 1 and 5.

Referring to FIGS. 1 and 5, the frequency multiplier 100 may perform operations for infinite phase shift in one direction.

For example, in operation S510, the first controller 140 may decrease the delay of the DCDL 110 to decrease the phase of an output clock signal of the MDLL 120.

While the first controller 140 decreases the delay of the DCDL 110, the first controller 140 may determine, in operation S520, whether the delay of the DCDL 110 reaches a minimum delay.

When the delay of the DCDL 110 does not reach the minimum delay, the first controller 140 may maintain the frequency multiplication ratio of the MDLL 120 in operation S530.

Moreover, in operation S540, the first controller 140 may continue to decrease the delay of the DCDL 110.

When the delay of the DCDL 110 decrease and reaches the minimum delay, the first controller 140 may increase the frequency multiplication ratio of the MDLL 120 in operation S550, such as incrementing by 1 without limitation thereto.

Moreover, in operation S560, the first controller 140 may change the delay of the DCDL 110 from the minimum delay to a maximum delay. After the delay of the DCDL 110 is changed from the minimum delay to the maximum delay, the period of the output clock signal of the DCDL 110 may be greater than the period of an input clock signal CK of the DCDL 110 by a value, which value is a difference between a maximum delay of DCDL 110 and a minimum delay of DCDL 110. Therefore, when a value, which value is a difference between a maximum delay of DCDL 110 and a minimum delay of DCDL 110, is substantially equal to one period of the output clock signal of the MDLL 120 and the delay of the DCDL 110 is changed from the minimum delay to the maximum delay, the period of the output clock signal of the DCDL 110 may be greater than the period of the input clock signal CK of the DCDL 110 by one period of the output clock signal of the MDLL 120. Therefore, when a value, which value is a difference between a maximum delay of DCDL 110 and a minimum delay of DCDL 110, is substantially equal to one period of the output clock signal of the MDLL 120 and the delay of the DCDL 110 reaches the minimum delay, the frequency multiplication ratio of the MDLL 120 may be increased, such as incrementing by 1 without limitation thereto, and the delay of the DCDL 110 may be changed from the minimum delay to the maximum delay where the MDLL 120 may output a clock signal having the same period as before without error.

In operation S570, the first controller 140 may again decrease the frequency multiplication ratio of the MDLL 120, such as decrementing by 1 without limitation thereto.

In addition, because the delay of the DCDL 110 is changed from the minimum delay to the maximum delay, the delay of the DCDL 110 may be decreased again to the minimum delay, and thus, the phase of the output clock signal of the MDLL 120 may continue to decrease. In addition, when the delay of the DCDL 110 reaches the minimum delay again, the first controller 140 may repeat the operations described above. Therefore, the frequency multiplier 100 may realize infinite phase shift in one direction even when the delay of the DCDL 110 have maximum and minimum values.

Figure 6:
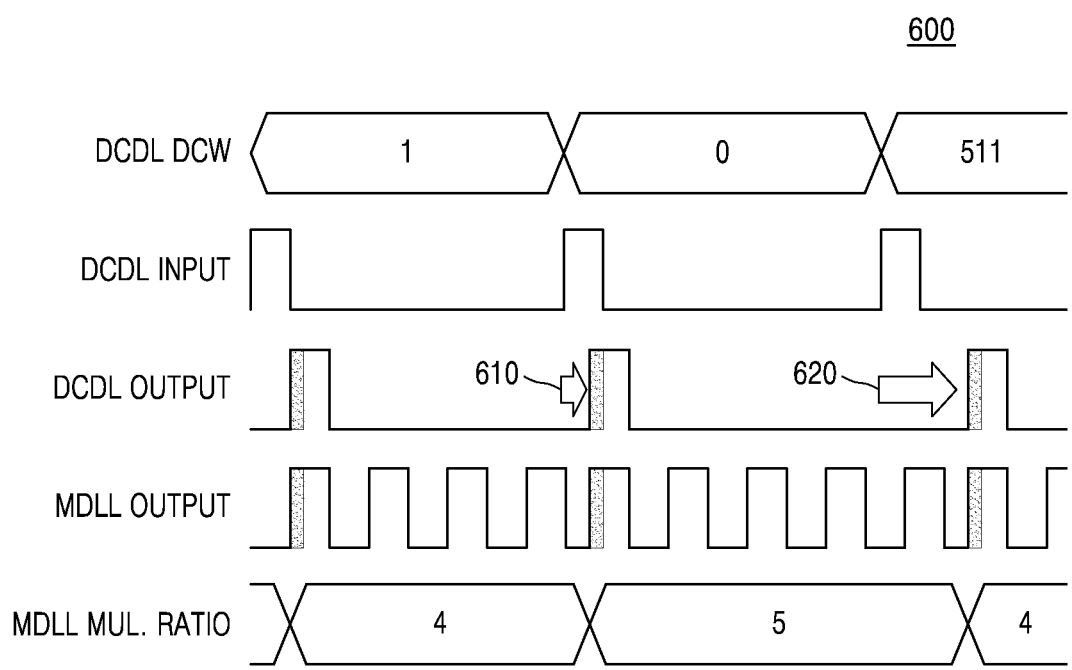
FIG. 6 is a timing diagram illustrating operations of a frequency multiplier according to an embodiment.

FIG. 6 illustrates signal timing operations of the frequency multiplier 100 according to an embodiment. A description may now be provided with reference to FIGS. 6 and 1.

A DCDL DCW signal may be a signal corresponding to the MSB of a result of multiplication of an output signal of the DCDL calibration circuit 130 and an output signal of the first controller 140.

Referring to FIGS. 6 and 1, the DCDL 110 may determine the delay of the DCDL 110 based on the DCDL DCW signal. For example, as the value of the DCDL DCW signal increases, the delay of the DCDL 110 may also increase, and as the value of the DCDL DCW signal decreases, the delay of the DCDL 110 may also decrease. In addition, assuming that the value of the DCDL DCW signal may range from 0 to 511 (that is, assuming that a DCW signal has 9 bits), the delay of the DCDL 110 may have a maximum delay 620 when the value of the DCDL DCW signal is 511. In addition, when the value of the DCDL DCW signal is 0, the delay of the DCDL 110 may have a minimum delay 610.

The frequency multiplier 100 may perform operations for infinite phase shift in one direction. For example, when the value of the DCDL DCW signal reaches the minimum value of 0 while the value of the DCDL DCW signal is decreased to decrease the phase of an output signal of the MDLL 120, the frequency multiplication ratio of the MDLL 120 may be increased, such as incrementing by 1 without limitation thereto. For example, when the value of the DCDL DCW signal reaches 0 while the frequency multiplication ratio of the MDLL 120 is maintained at 4, the frequency multiplication ratio of the MDLL 120 may be changed to 5. In addition, when the value of the DCDL DCW signal reaches the minimum value of 0, the first controller 140 may change the value of the DCDL DCW signal to the maximum value of 511. Therefore, the delay of the DCDL 110 may be changed from the minimum delay 610 to the maximum delay 620. Therefore, when the delay of the DCDL 110 is changed from the minimum delay 610 to the maximum delay 620, the period of an output clock signal of the DCDL 110 may be greater than the period of an input clock signal CK of the DCDL 110 by a value, which value is a difference between a maximum delay 620 of DCDL 110 and a minimum delay 610 of DCDL 110. Therefore, when a value, which value is a difference between a maximum delay 620 of DCDL 110 and a minimum delay 610 of DCDL 110, is substantially equal to one period of an output clock signal of MDLL 120 and the delay of DCDL 110 is changed from the minimum delay 610 to the maximum delay 620, the period of the output clock signal of the DCDL 110 may be greater than the period of the input clock signal CK of the DCDL 110 by one period of an output clock signal of the MDLL 120. Therefore, when a value, which value is a difference between a maximum delay 610 of DCDL 110 and a minimum delay 620 of DCDL 110, is substantially equal to one period of the output clock signal of MDLL 120 and the delay of DCDL 110 reaches the minimum delay 620, the frequency multiplication ratio of the MDLL 120 may be increased, such as incrementing by 1 without limitation thereto, and the delay of the DCDL 110 may be changed from the minimum delay 6200 to the maximum delay 610, thereby allowing the MDLL 120 to output a clock signal having the same period as before without error as shown in FIG. 6.

Figure 7:
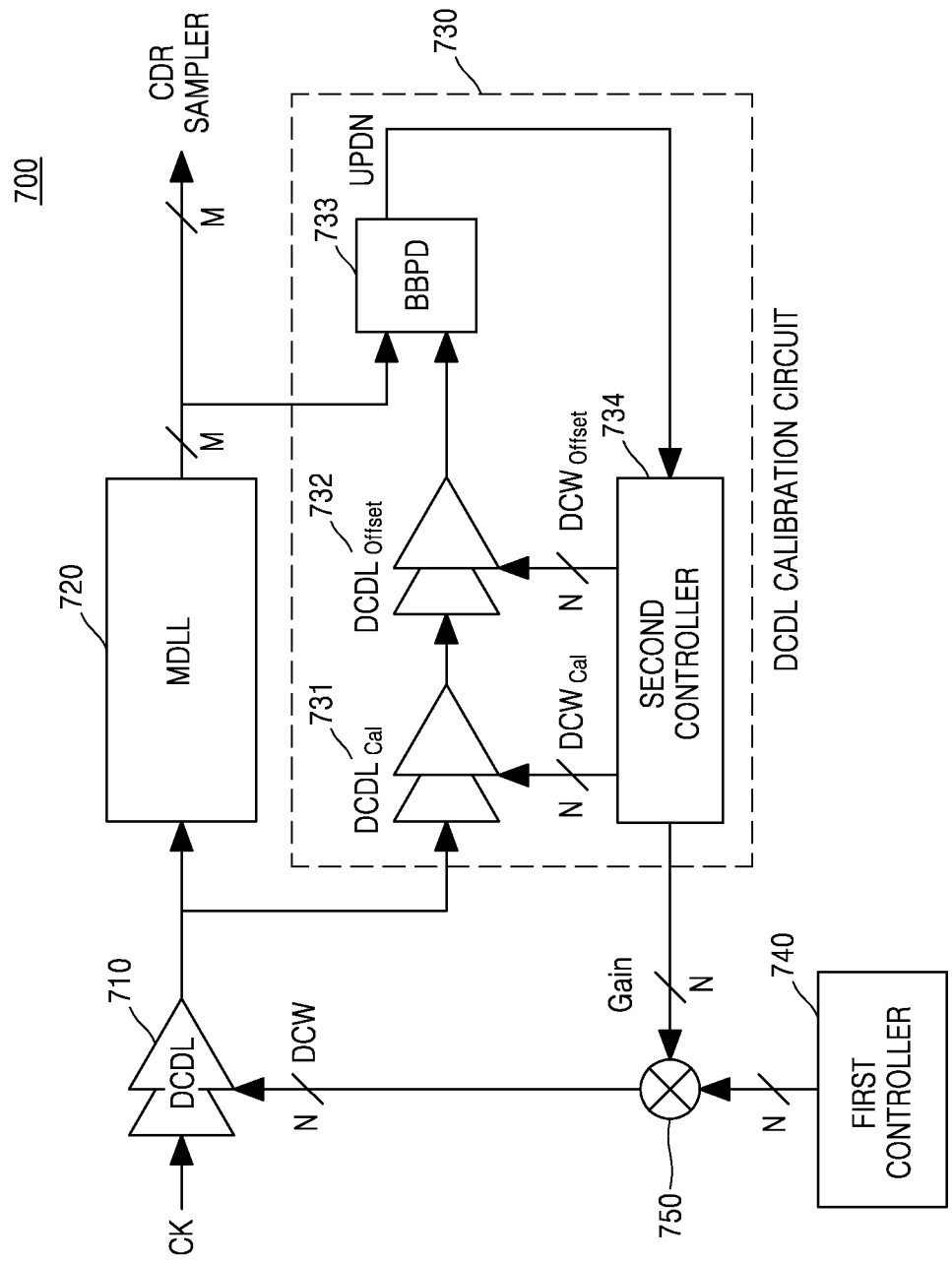
FIG. 7 is a block diagram illustrating a frequency multiplier according to an embodiment.

FIG. 7 illustrates a frequency multiplier 700 according to an embodiment.

Referring to FIG. 7, the frequency multiplier 700 of this embodiment may include a DCDL 710, a MDLL 720, a DCDL calibration circuit 730, a first controller 740, and a multiplier 750.

The DCDL 710 may be configured to change the phase of an input clock signal CK. For example, the DCDL 710 may be configured to control a delay between the input clock signal CK and an output clock signal based on a DCW signal. For example, when a clock signal CK having a constant frequency is input, the DCDL 710 may increase or decrease the phase of an output clock signal by increasing or decreasing the delay of the input clock signal CK. In other words, the DCDL 710 may perform a phase shift function for the input clock signal CK. However, because there are maximum and minimum values of delay that may be controlled by the DCDL 710, it may be challenging to implement infinite phase shift by using the DCDL 710. However, the frequency multiplier 700 of this embodiment may implement infinite phase shift because the frequency multiplier 700 includes the DCDL 710 and the MDLL 720.

Because the structure of the DCDL 710 is not complex, the linearity of the DCDL 710 may be optimized. The linearity of the frequency multiplier 700 may be optimized by optimizing the linearity of the DCDL 710.

The MDLL 720 may be configured to receive an output clock signal of the DCDL 710, and may be further configured to multiply the frequency of the received clock signal. Therefore, even when an input signal of the DCDL 710 is a low frequency clock signal, a high frequency clock signal may be generated using the MDLL 720. Therefore, power consumption for generating an input clock signal CK may be minimized.

A rising edge of an output clock signal of the MDLL 720 may coincide with a rising edge of an input clock signal of the MDLL 720. Therefore, when the phase of the input clock signal of the MDLL 720 increases, the phase of the output click signal of the MDLL 720 may also increase in the same direction, and when the phase of the input clock signal of the MDLL 720 decreases, the phase of the output clock signal of the 720 MDLL may also decrease in the same direction. The MDLL 720 may also be configured to generate multi-phase clock signals. For example, as shown in FIG. 7, the MDLL 720 may be configured to generate clock signals having four phases, but is not limited thereto. Because the MDLL 720 may generate multi-phase clock signals, additional power consumption and additional hardware need not be supported even when a plurality of clock phases are used.

The DCDL calibration circuit 730 may be configured to receive an output clock signal of the DCDL 710 and control the gain of the DCDL 710. The difference between the maximum and minimum delay values of the DCDL 710 may coincide with the period of the output clock signal of the MDLL 720 to implement infinite phase shift. The DCDL calibration circuit 730 may calibrate the gain of the DCDL 710 where the difference between the maximum and minimum delay values of the DCDL 710 may coincide with the period of the output clock signal of the MDLL 720.

The DCDL calibration circuit 730 may include a DCDL-$_{Cal}$ 731, a DCDL$_{Offset}$ 732, a bang-bang phase detector (BBPD) 733, and/or a second controller 734. In this case, the DCDL 710, the DCDL$_{Cal}$ 731, and the DCDL$_{Offset}$ 732 may be DCDLs having the same specifications. The DCDL 710 may be referred to as a first DCDL, the DCDL$_{Cal}$ 731 may be referred to as a second DCDL, and the DCDL$_{Offset}$ 732 may be referred to as a third DCDL. In addition, the first controller 740 may be referred to as a logic controller, and the second controller 734 may be referred to as a gain controller.

The DCDL$_{Cal}$ 731 may be a DCDL for calibrating the gain of the DCDL 710. For example, the second controller 734 may be configured to set the delay of the DCDL$_{Cal}$ 731 to a maximum value and adjust the gain of the DCDL 710 by detecting the phase difference between an output signal of the MDLL 720 and an output signal of the DCDL$_{Cal}$ 731 from which an offset is removed. A specific description may be provided of how the gain of the DCDL 710 is adjusted.

The DCDL$_{Offset}$ 732 may be a DCDL configured to remove the phase difference between the output signal of the DCDL$_{Cal}$ 731 and the output signal of the MDLL 720, that is, a DCDL configured to remove a phase offset. For example, the second controller 734 may be configured to remove a phase offset by setting the delay of the DCDL$_{Cal}$ 731 to a minimum value, detecting the phase difference between the output signal of the DCDL$_{Cal}$ 731 and the output signal of the MDLL 720, and adjusting the delay of DCDL$_{Offset}$ 732. A specific description is provided later of how a phase offset is removed.

The BBPD 733 may be configured to detect the phase difference between the output signal of the DCDL$_{Offset}$ 732 and the output signal of the MDLL 720. For example, the BBPD 733 may generate an UP signal when the phase of the output signal of the DCDL$_{Offset}$ 732 is greater than the phase of the output signal of the MDLL 720, and a DOWN signal when the phase of the output signal of the MDLL 720 is greater than the phase of the output signal of the DCDL$_{Offset}$ 732. Conversely, the BBPD 733 may generate a DOWN signal when the phase of the output signal of the DCDL$_{Offset}$ 732 is greater than the phase of the output signal of the MDLL 720, and an UP signal when the phase of the output signal of the MDLL 720 is greater than the phase of the output signal of the DCDL$_{Offset}$ 732.

The second controller 734 may be configured to remove a phase offset of DCDL$_{Cal}$ 731 or adjust the gain of DCDL 710 based on the phase difference between the output signal of the DCDL$_{Offset}$ 732 and the output signal of MDLL 720, without limitation thereto.

The second controller 734 may be configured to control operations of the DCDL 710, the DCDL$_{Cal}$ 731, and/or the DCDL$_{Offset}$ 732. For example, the second controller 734 may be configured to adjust the delay of DCDL$_{Cal}$ 731 and the delay of the DCDL$_{Offset}$ 732. For example, the second controller 734 may be configured to adjust the delay of the DCDL$_{Cal}$ 731 by inputting a DCW$_{Cal}$ signal to the DCDL$_{Cal}$ 731 and adjust the delay of the DCDL$_{Offset}$ 731 by inputting a DCW$_{Offset}$ signal to the DCDL$_{Offset}$ 731. For example, the second controller 734 may transmit an N-bit DCW$_{Cal}$ signal to the DCDL$_{Cal}$ 731 and an N-bit DCW$_{Offset}$ signal to the DCDL$_{Offset}$ 732 to adjust the delay of the DCDL$_{Cal}$ 731 and the delay of the DCDL$_{Offset}$ 732. However, the number of bits of DCW signals is not limited thereto.

The second controller 734 may be configured to generate a signal Gain for adjusting the gain of the DCDL 710 based on an output signal UPDN of the BBPD 733. In other words, the second controller 734 may control the gain of the DCDL 710 based on the phase difference between the output signal of the DCDL$_{Offset}$ 732 and the output signal of the MDLL 720. A specific description may be provided of how the gain of the DCDL 710 is adjusted.

The first controller 740 may be configured to control the delay of the DCDL 710 and the frequency multiplication ratio of the MDLL 720. For example, the first controller 740 may perform control to gradually increase the delay of the DCDL 710, and when the delay of the DCDL 710 reaches a maximum delay of the DCDL 710, the first controller 740 may change the delay of the DCDL 710 to a minimum delay of the DCDL 710. In addition, the first controller 740 may decrease the frequency multiplication ratio of the MDLL 720, such as decrementing by 1 without limitation thereto, when the delay of the DCDL 710 reaches the maximum delay of the DCDL 710. In addition, the first controller 740 may perform control to gradually decrease the delay of the DCDL 710, and when the delay of the DCDL 710 reaches the minimum delay of the DCDL 710, the first controller 740 may change the delay of the DCDL 710 to the maximum delay of the DCDL 710. In addition, the first controller 740 may increase the frequency multiplication ratio of the MDLL 720, such as incrementing by 1 without limitation thereto, when the delay of the DCDL 710 reaches the minimum delay of the DCDL 710. However, the operations described above are merely examples of operations of the first controller 740, and the operations of the first controller 740 are not limited thereto.

The multiplier 750 may be configured to multiply together an output signal of the DCDL calibration circuit 730 and an output signal of the first controller 740. In addition, the multiplier 750 may transmit results of the multiplication to the DCDL 710, and a signal transmitted from the multiplier 750 to the DCDL 710 may be used as a DCW signal of the DCDL 710. For example, the DCDL calibration circuit 730 may transmit an N-bit gain control signal to the multiplier 750 for controlling the gain of the DCDL 710. In addition, the first controller 740 may transmit, to the multiplier 750, an N-bit logic signal for controlling the delay of the DCDL 710 or the frequency multiplication ratio of the MDLL 720. The multiplier 750 may multiply the N-bit gain control signal and the N-bit logic signal together, and transmit the MSB (for example, N bit) of the multiplication result to the DCDL 710. The MSB transmitted to the DCDL 710 may be used as a DCW signal of the DCDL 710. For example, the frequency multiplier 700 may control the delay and gain of the DCDL 710 and the frequency multiplication ratio of the MDLL 720 based on the DCW signal.

The frequency multiplier 700 may be used in connection with a CDR circuit. For example, assuming that the frequency multiplier 700 is connected with a CDR circuit, an output signal of the MDLL 720 may be a CDR sampler. In addition, instead of the first controller 740, a controller included in a CDR circuit may be connected to the multiplier 750, and a CDR logic signal may be input to the multiplier 750. For example, the multiplier 750 may transmit, to the DCDL 710, the MSB of a result of multiplication of a value of a digital loop filter of the CDR circuit and an output signal of the DCDL calibration circuit 730, and the DCDL 710 may use a signal received from the multiplier 750 as a DCW signal.

Figure 8:
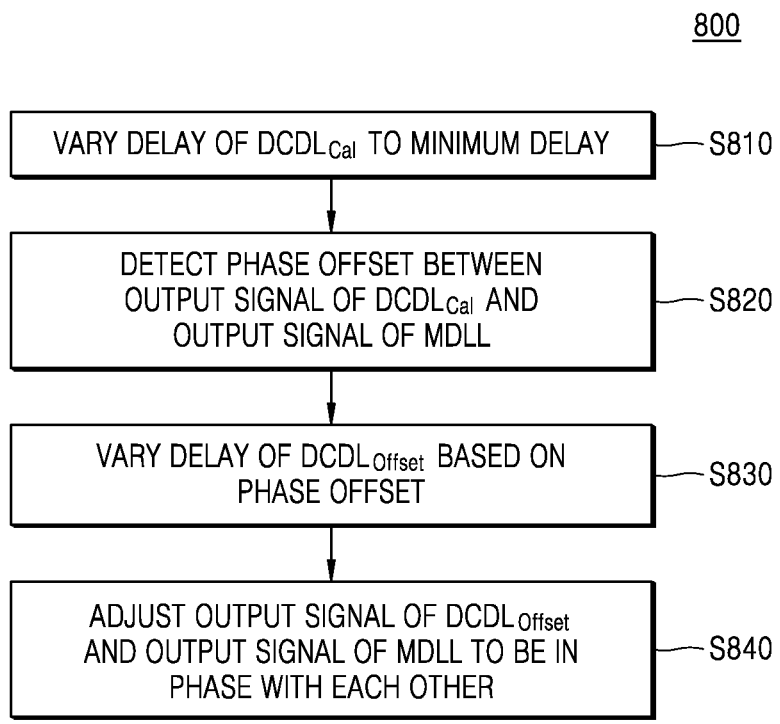
FIG. 8 is a flowchart diagram illustrating operations of a frequency multiplier according to an embodiment.

FIG. 8 illustrates method step operations 800 of the frequency multiplier 700 according to an embodiment. A description may now be provided with reference to FIGS. 8 and 7.

Referring to FIGS. 7 and 8, the frequency multiplier 700 may be configured to remove a phase offset caused by the $DCDL_{Cal}$ 731.

For example, in operation S810, the second controller 734 may change the delay of the $DCDL_{Cal}$ 731 to a minimum value. For example, the $DCDL_{Cal}$ 731 may change the delay of the $DCDL_{Cal}$ 731 to a minimum delay based on a $DCW_{Cal}$ signal. For example, when the value of the $DCW_{Cal}$ signal is 0, the delay of the $DCDL_{Cal}$ 731 may be the minimum delay. Therefore, the second controller 734 may change the value of the $DCW_{Cal}$ signal to 0 to adjust the delay of the $DCDL_{Cal}$ 731 to the minimum delay.

In operation S820, the second controller 734 may be configured to detect a phase offset between an output signal of the $DCDL_{Cal}$ 731 and an output signal of the MDLL 720. For example, the second controller 734 may detect a phase offset between the output signal of the $DCDL_{Cal}$ 731 and the output signal of the MDLL 720 by using the BBPD 733 based on a phase difference between the output signal of the $DCDL_{Offset}$ 732 and the output signal of the MDLL 720.

In operation S830, the second controller 734 may change the delay of the $DCDL_{Offset}$ 732 based on the detected phase offset. For example, the second controller 734 may adjust the delay of the $DCDL_{Offset}$ 732 to remove the phase difference between the output signal of the $DCDL_{Offset}$ 732 and the output signal of the MDLL 720, without limitation thereto.

In operation S840, the second controller 734 may adjust the output signal of the $DCDL_{Offset}$ 732 and the output signal of the MDLL 720 to be in phase with each other by changing the delay of the $DCDL_{Offset}$ 732. The second controller 734 may remove the phase offset between the output signal of the $DCDL_{Cal}$ 731 and the output signal of the MDLL 720 by adjusting the output signal of the $DCDL_{Offset}$ 732 and the output signal of the MDLL 720 to be in phase with each other.

Figure 9:
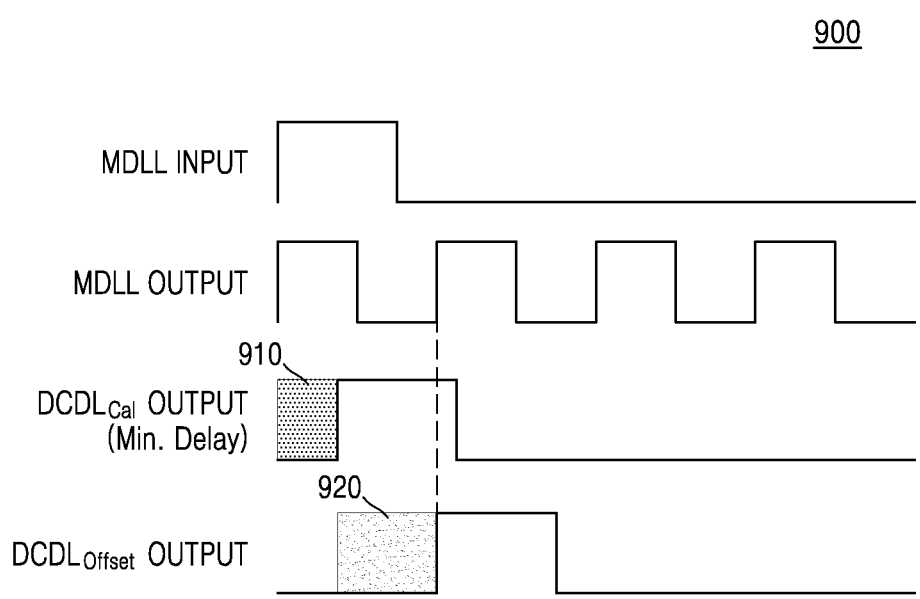
FIG. 9 is a timing diagram illustrating operations of a frequency multiplier according to an embodiment.

FIG. 9 illustrates signal timing operations 900 of the frequency multiplier 700 according to an embodiment. A description may now be provided with reference to FIGS. 9 and 7.

Referring to FIGS. 7 and 9, the delay of the $DCDL_{Cal}$ 731 may be a minimum delay (Min. Delay) 910.

There may be a phase offset 920, that is, a phase difference, between an output signal of the MDLL 720 and an output signal of the $DCDL_{Cal}$ 731. The second controller 732 may detect the phase offset using the BBPD 733. In addition, the second controller 734 may set the delay of the $DCDL_{Offset}$ 732 to be substantially equal to the phase offset 920, thereby adjusting an output signal of the $DCDL_{Offset}$ 732 and the output signal of the MDLL 720 to be in phase with each other. The second controller 734 may remove the phase offset 920 by adjusting the output signal of the $DCDL_{Offset}$ 732 and the output signal of the MDLL 720 to be in phase with each other.

Figure 10:
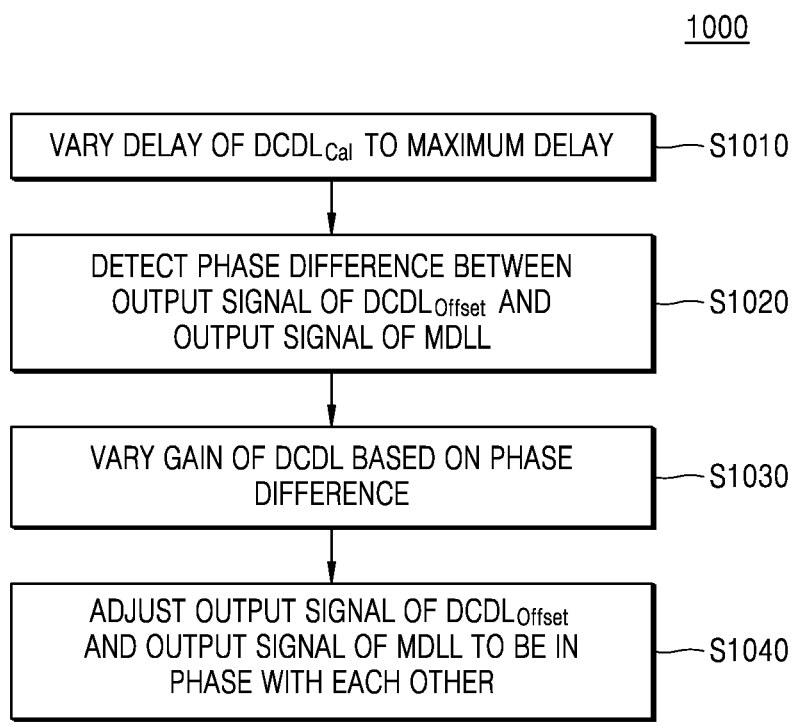
FIG. 10 is a flowchart diagram illustrating operations of a frequency multiplier according to an embodiment.

FIG. 10 illustrates method step operations 1000 of the frequency multiplier 700 according to an embodiment. A description may now be provided with reference to FIGS. 10 and 7.

Referring to FIGS. 7 and 10, the second controller 734 may be configured to adjust the gain of the DCDL 710. For example, the second controller 734 may adjust the delay of the DCDL 710 where the difference between the maximum delay and the minimum delay of the DCDL 710 may be substantially equal to the period of an output signal of the MDLL 720.

For example, in operation S1010, the second controller 734 may change the delay of the $DCDL_{Cal}$ 731 to the maximum delay. For example, the second controller 734 may change the delay of the $DCDL_{Cal}$ 731 to the maximum delay based on a $DCW_{Cal}$ signal. Assuming that the delay of the $DCDL_{Cal}$ 731 is the maximum delay when the value of the $DCW_{Cal}$ signal is 511, the second controller 734 may change the value of the $DCW_{Cal}$ signal to 511 to adjust the delay of the $DCDL_{Cal}$ 731 to the maximum delay. In this case, the $DCDL_{Offset}$ 732 may have a delay substantially equal to a phase offset, and thus a phase offset caused by the $DCDL_{Cal}$ 731 may be removed.

In operation S1020, the second controller 734 may detect a phase difference between an output signal of the $DCDL_{Offset}$ 732 and the output signal of the MDLL 720. For example, the second controller 734 may detect the phase difference between the output signal of the $DCDL_{Offset}$ 732 and the output signal of the MDLL 720 by using the BBPD 733. Depending on the gain of the DCDL 710, a value, which value is a difference between a maximum delay of DCDL 710 and a minimum delay of DCDL 710, may change, and thus, different phase differences may be detected depending on the gain of the DCDL 710.

In operation S1030, the second controller 734 may change the gain of the DCDL 710 based on the detected phase difference. For example, the second controller 734 may change the gain of the DCDL 710 to adjust the output signal of the $DCDL_{Offset}$ 732 and the output signal of the MDLL 720 to be in phase with each other.

In operation S1040, the second controller 734 may adjust the output signal of the $DCDL_{Offset}$ 732 and the output signal of the MDLL 720 to be in phase with each other by adjusting the gain of the DCDL 710. When a value, which value is a difference between a maximum delay of DCDL 710 and a minimum delay of DCDL 710, is substantially equal to the period of the output signal of the MDLL 720, the output signal of the $DCDL_{Offset}$ 732 and the output signal of the MDLL 720 may be in phase with each other. Therefore, the frequency multiplier 700 may implement infinite phase shift by adjusting the output signal of the $DCDL_{Offset}$ 732 and the output signal of the MDLL 720 to be in phase with each other when the delay of the $DCDL_{Cal}$ 731 is maximal.

When the gain of the DCDL 710 is greater than a desired value, such as a value at which a difference between a maximum delay of DCDL 710 and a minimum delay of DCDL 710 is substantially equal to the period of the output signal of the MDLL 720, the phase of the output signal of the $DCDL_{Offset}$ 732 may be greater than the phase of the output signal of the MDLL 720. In addition, when the gain of the DCDL 710 is less than the desired value, such as a value at which a difference between a maximum delay of DCDL 710 and a minimum delay of DCDL 710 is substantially equal to the period of the output signal of the MDLL 720, the phase of the output signal of the $DCDL_{Offset}$ 732 may be less than the phase of the output signal of the MDLL 720. Therefore, the second controller 734 may detect the phase difference between the output signal of the $DCDL_{Offset}$ 732 and the output signal of the MDLL 720 by using the BBPD 733 and may increase or decrease the gain of the DCDL 710 according to the detected phase difference, thereby adjusting a value, which value is a difference between a maximum delay of DCDL 710 and a minimum delay of DCDL 710, to be substantially equal to the period of the output signal of the MDLL 720.

Figure 11:
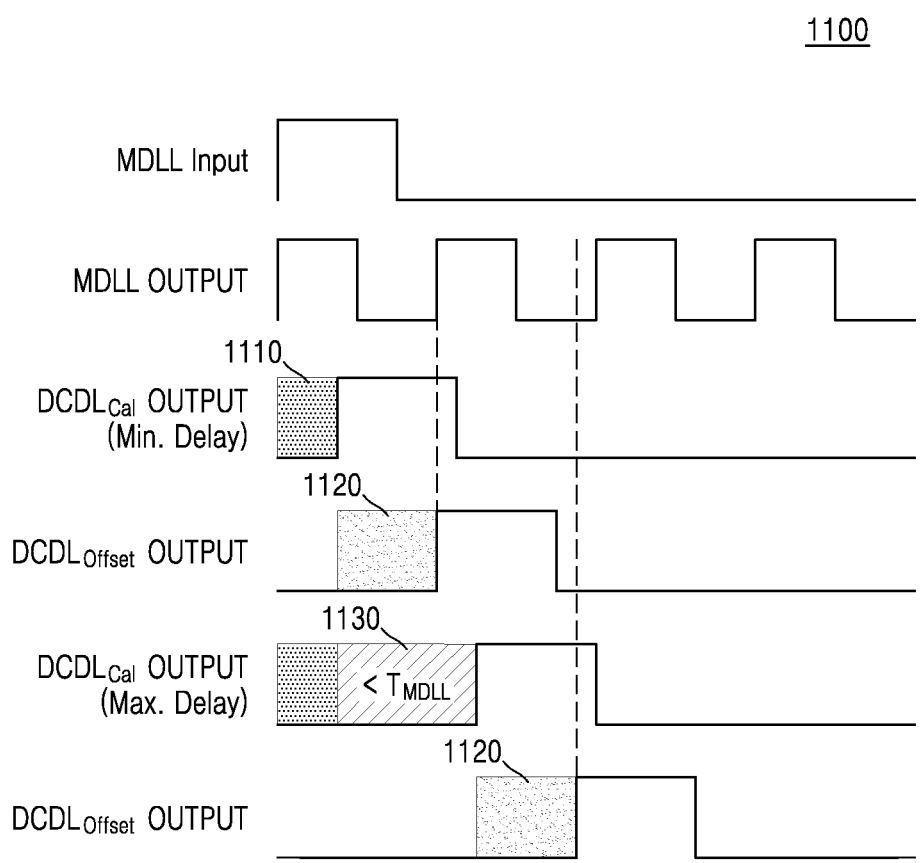
FIG. 11 is a timing diagram illustrating operations of a frequency multiplier according to an embodiment.

FIG. 11 illustrates signal timing operations 1100 of the frequency multiplier 700 according to an embodiment. A description may be provided with reference to FIGS. 11 and 7.

Referring to FIGS. 7 and 11, when a value of a delay difference 1130, which value is a difference between a maximum delay of DCDL 710 and a minimum delay 1110 of DCDL 710, is less than the period of an output signal of the MDLL 720, there may be a phase difference between an output signal of the $DCDL_{Offset}$ 732 and an output signal of the MDLL 720. In this case, a phase offset caused by $DCDL_{Cal}$ 731 may be removed, and thus, the delay of the $DCDL_{Offset}$ 732 may be substantially equal to a phase offset 1120.

Because a value of the delay difference 1130, which value is a difference between a maximum delay of DCDL 710 and a minimum delay 1110 of DCDL 710, is less than the period of the output signal of MDLL 720, the phase of the output signal of the $DCDL_{Offset}$ 732 may be less than the phase of the output signal of the MDLL 720 when the delay of the $DCDL_{Cal}$ 731 is maximal. Therefore, the second controller 734 may increase the value of the delay difference 1130, which value is a difference between a maximum delay of DCDL 710 and a minimum delay 1110 of DCDL 710, by increasing the gain of the DCDL 710. In addition, the second controller 734 may adjust the output signal of the $DCDL_{Offset}$ 732 and the output signal of the MDLL 720 to be in phase with each other by increasing the value of the delay difference 1130, which value is a difference between a maximum delay of DCDL 710 and a minimum delay 1110 of DCDL 710. When the output signal of the $DCDL_{Offset}$ 732 is in phase with the output signal of the MDLL 720, the value of the delay difference 1130, which value is a difference between a maximum delay of DCDL 710 and a minimum delay 1110 of DCDL 710, is substantially equal to the period of the output signal of the MDLL 720, and thus, the frequency multiplier 700 may perform an infinite phase shift operation by adjusting the gain of the DCDL 710.

Figure 12:
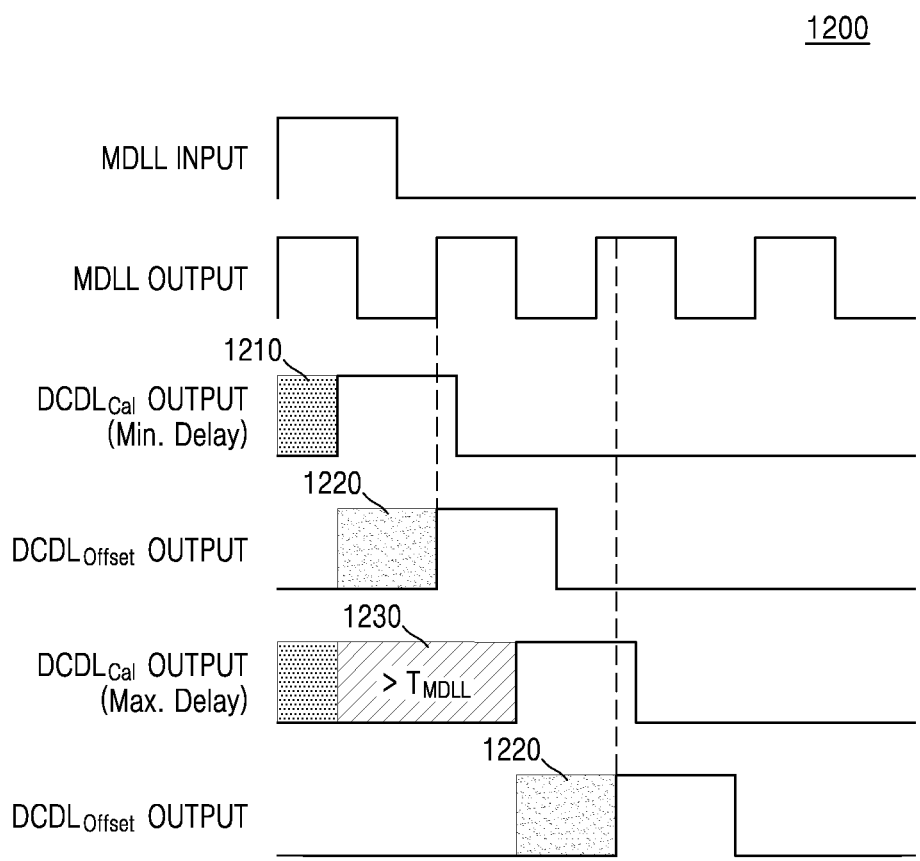
FIG. 12 is a timing diagram illustrating operations of a frequency multiplier according to an embodiment.

FIG. 12 illustrates signal timing operations 1200 of the frequency multiplier 700 according to an embodiment. A description may be provided with reference to FIGS. 12 and 7.

Referring to FIGS. 7 and 12, when a value of a delay difference 1230, which value is a difference between a maximum delay of DCDL 710 and a minimum delay 1210 of DCDL 710, is greater than the period of an output signal of the MDLL 720, there may be a phase difference between an output signal of the $DCDL_{Offset}$ 732 and an output signal of the MDLL 720. In this case, a phase offset caused by $DCDL_{Cal}$ 731 may be removed, and thus, the delay of the $DCDL_{Offset}$ 732 may be substantially equal to a phase offset 1220.

Because the value of the delay difference 1230, which value is a difference between a maximum delay of DCDL 710 and a minimum delay 1210 of DCDL 710, is greater than the period of the output signal of MDLL 720, the phase of the output signal of the $DCDL_{Offset}$ 732 may be greater than the phase of the output signal of the MDLL 720 when the delay of the $DCDL_{Cal}$ 731 is maximal. Therefore, the second controller 734 may decrease the value of the delay difference 1230, which value is a difference between a maximum delay of DCDL 710 and a minimum delay 1210 of DCDL 710, by decreasing the gain of the DCDL 710. In addition, the second controller 734 may adjust the output signal of the $DCDL_{Offset}$ 732 and the output signal of the MDLL 720 to be in phase with each other by decreasing the value of the delay difference 1230, which value is a difference between a maximum delay of DCDL 710 and a minimum delay 1210 of DCDL 710. When the output signal of the $DCDL_{Offset}$ 732 is in phase with the output signal of the MDLL 720, the value of the delay difference 1230, which value is a difference between a maximum delay of DCDL 710 and a minimum delay 1210 of DCDL 710, is substantially equal to the period of the output signal of the MDLL 720, and thus, the frequency multiplier 700 may perform an infinite phase shift operation by adjusting the gain of the DCDL 710.

Figure 13:
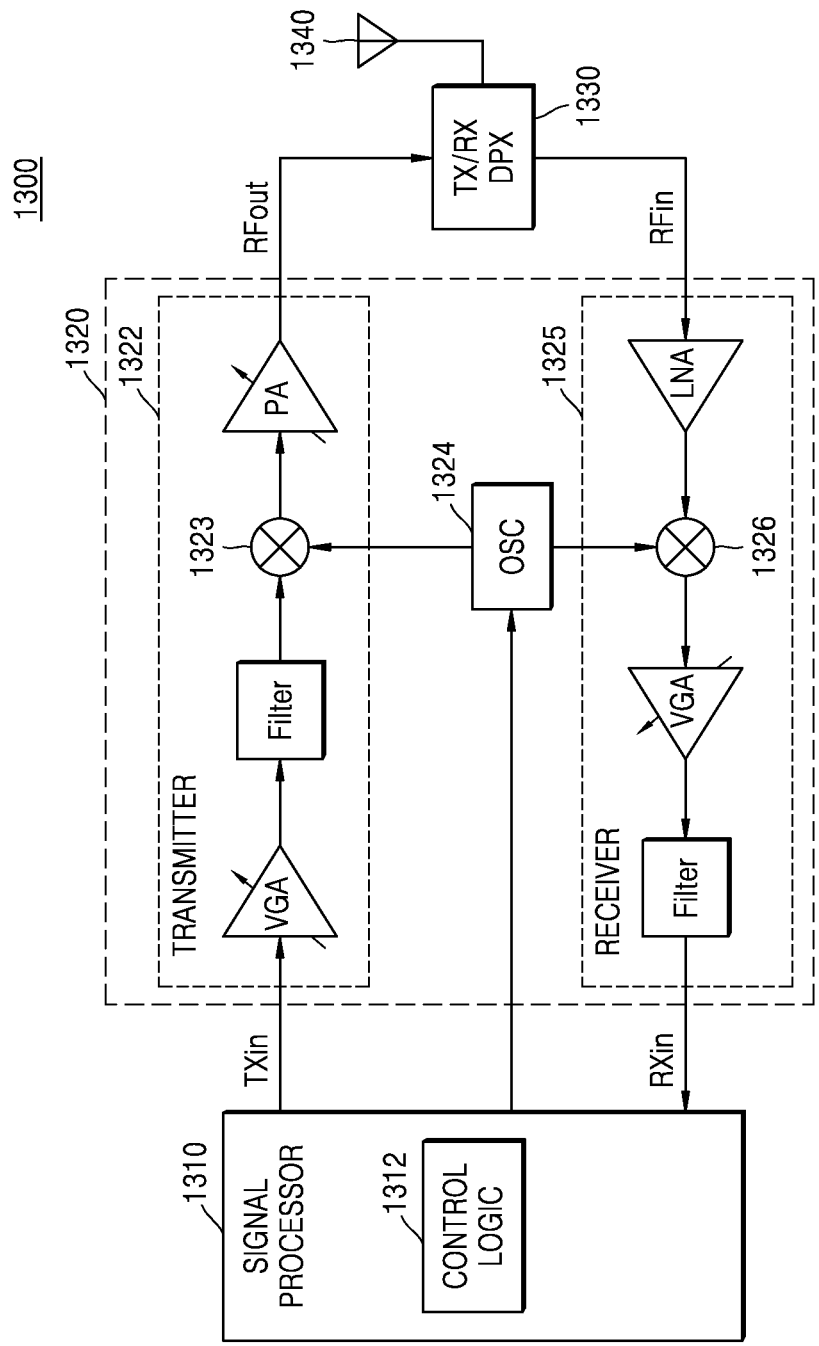
FIG. 13 is a block diagram illustrating a wireless communications device according to an embodiment.

FIG. 13 illustrates a wireless communications device 1300 according to an embodiment.

The wireless communications device 1300 includes an antenna 1340, and may communicate with a counterpart device by transmitting or receiving signals through the antenna 1340. In a non-limiting example, a wireless communications system in which the wireless communications device 1300 communicates with a counterpart device may be: a wireless communications system using a cellular network, such as a 5th generation wireless (5G) system, a long term evolution (LTE) system, an LTE-advanced system, a code division multiple access (CDMA) system, or a global system for mobile communications (GSM) system; a wireless local area network (WLAN) system; or any other wireless communications system.

In an embodiment, the wireless communications device 1300 may include a signal processor 1310, a transceiver 1320, and a transmission/reception duplexer 1330. The transmission/reception duplexer 1330 may provide a signal received through the antenna 1340 to the transceiver 1320 as a radio-frequency (RF) input signal RFin, and may provide an RF output signal RFout received from the transceiver 1320 to the antenna 1340.

Depending on design criteria and/or implementation details, the signal processor 1310 may be a baseband processor and may include control logic 1312. The signal processor 1310 may process a baseband transmit/receive signal. For example, the signal processor 1310 may generate a baseband signal for a transmit signal path of the transceiver 1320 and may process a baseband signal received through a receive signal path of the transceiver 1320.

In an embodiment, the transceiver 1320 may include a transmitter 1322, a receiver 1325, and a frequency oscillator circuit (OSC) 1324.

The frequency oscillator circuit 1324 may include a frequency multiplier according to an embodiment.

The transmitter 1322 may generate an RF output signal RFout by processing a transmit input signal TXin received from the signal processor 1310. As shown in FIG. 13, the transmitter 1322 may include a variable gain amplifier (VGA), a TX filter, a TX mixer 1323, and a power amplifier (PA) to process a transmit input signal TXin. The receiver 1325 may generate a receive input signal RXin by processing an RF input signal RFin and may provide the receive input signal RXin to the signal processor 1310. The receiver 1325 may include a low noise amplifier (LNA), an RX mixer 1326, a variable gain amplifier (VGA), and an RX filter to process an RF input signal RFin.

Although FIG. 13 illustrates an example in which control information is provided from the signal processor 1310, embodiments are not limited thereto. For example, control information may be generated inside the transceiver 1320, or may be generated from other control circuitry outside the transceiver 1320.

Figure 14:
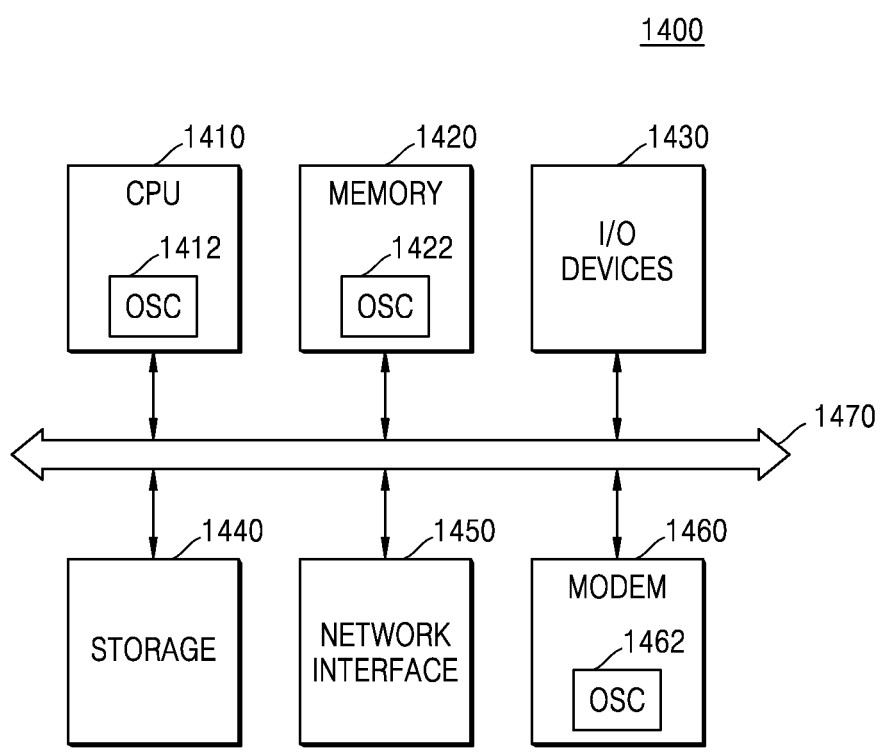
FIG. 14 is a block diagram illustrating a computing system according to an embodiment.

FIG. 14 illustrates a computing system 140 according to an embodiment.

The computing system 1400 may be a stationary computing system, such as a desktop computer, a workstation, or a server, or a portable computing system, such as a laptop computer. Includes the computing system 1400 may be a semiconductor device embodied with a semiconductor.

As shown in FIG. 14, the computing system 1400 may include a central processing unit (CPU) 1410, a memory 1420, input/output devices 1430, a storage 1440, a network interface 1450, and a modem 1460. The CPU 1410, the memory 1420, the input/output devices 1430, the storage 1440, the network interface 1450, and the modem 1460 may be connected to a bus 1470, and may communicate with each other through the bus 1470.

The CPU 1410 may be referred to as a processing unit. For example, the CPU 1410 may include at least one core capable of executing an instruction set. For example, the least one core may include an Intel Architecture-32 (IA-32), 64-bit extension IA-32, x86-64, PowerPC, Sparc, MIPS, ARM, IA-64, or the like, such as a micro-processor, an application processor (AP), a digital signal processor (DSP), or a graphic processing unit (GPU). For example, the CPU 1410 may access the memory 1420 via the bus 1470 and may execute instructions stored in RAM or ROM.

In addition, the CPU 1410 may include the oscillator 1412. For example, the oscillator 1412 may generate a clock signal for an operation of the CPU 1410 using a clock signal, and may change or multiply the frequency of the clock signal according to circumstances. For example, the oscillator 1412 may include a frequency multiplier according to an embodiment.

The memory 1420 may include a volatile memory (i.e., random-access memory (RAM)) such as dynamic random-access memory (DRAM), or a non-volatile memory such as flash memory or read-only memory (ROM).

In addition, the memory 1420 may include an oscillator 1422. For example, the oscillator 1422 may generate a clock signal for an operation of the CPU 1410 using a clock signal, and may change or multiply the frequency of the clock signal according to circumstances. For example, the oscillator 1422 may include a frequency multiplier according to an embodiment.

The input/output devices 1430 may include an input device such as a keyboard or a pointing device, and may include an output device such as a display device or a printer.

The storage 1440 may store data to be processed by the CPU 1410 or data processed by the CPU 1410. That is, the CPU 1410 may generate data by processing data stored in the storage 1440, and may store the generated data in the storage 1440.

The network interface 1450 may provide access to a network that is outside the computing system 1400. For example, the network may include a plurality of computing systems and a plurality of communications links, and the communications links may include wired links, optical links, wireless links, or any other type of link.

The modem 1460 may perform wireless communications or wired communications with an external device. For example, the modem 1460 may perform Ethernet communication, near field communications (NFC), radio frequency identification (RFID) communication, mobile telecommunication, memory card communication, universal serial bus (USB) communication, and/or the like, but is not limited thereto.

The modem 1460 may also include an oscillator 1462. For example, the oscillator 1462 may generate a clock signal for an operation of the modem 1460 using a clock signal, and may change or multiply the frequency of the clock signal according to circumstances. For example, the oscillator 1462 may include a frequency multiplier according to an embodiment.

Depending on implementation, the oscillators 1412, 1422, and 1462 may be configured as external independent devices, and may each further include a clock control unit configured to control frequencies of clock signals of the computing system 1400. Accordingly, different clock signals may be provided to the CPU 1410, the memory 1420, and the modem 1460, which operate at different operating frequencies.

While the inventive concept has been particularly shown and described by way of example with reference to illustrative embodiments thereof, it may be understood by those of ordinary skill in the pertinent art that various changes in form and details may be made therein without departing from the spirit and scope of the present disclosure as set forth in the following claims.

What is claimed is:

1. A frequency multiplier comprising:
a first digitally controlled delay line (DCDL) configured to receive a first clock signal and generate a second clock signal by changing a phase of the first clock signal;
a multiplying delay-locked loop (MDLL) configured to receive the second clock signal and generate a third clock signal by multiplying a frequency of the second clock signal; and
a DCDL calibration circuit configured to receive the second clock signal and generate a gain signal for adjusting a gain of the first DCDL,
wherein a difference between a maximum delay and a minimum delay of the first DCDL is substantially equal to a period of the third clock signal,
wherein the MDLL is further configured to output a plurality of clock signals having substantially different phases.

2. The frequency multiplier of claim 1, further comprising a first controller configured to control a delay of the first DCDL and a frequency multiplication ratio of the MDLL.

3. The frequency multiplier of claim 2, wherein the first controller is further configured to vary the delay of the first DCDL from the maximum delay of the first DCDL to the minimum delay of the first DCDL when the delay of the first DCDL reaches the maximum delay of the first DCDL in an operation of increasing the delay of the first DCDL.

4. The frequency multiplier of claim 2, wherein the first controller is further configured to decrement the frequency multiplication ratio of the MDLL when the delay of the first DCDL reaches the maximum delay of the first DCDL in an operation of increasing the delay of the first DCDL.

5. The frequency multiplier of claim 2, wherein the first controller is further configured to vary the delay of the first DCDL from the minimum delay of the first DCDL to the maximum delay of the first DCDL when the delay of the first DCDL reaches the minimum delay of the first DCDL in an operation of decreasing the delay of the first DCDL.

6. The frequency multiplier of claim 2, wherein the first controller is further configured to increment the frequency multiplication ratio of the MDLL when the delay of the first DCDL reaches the minimum delay of the first DCDL in an operation of decreasing the delay of the first DCDL.

7. The frequency multiplier of claim 1, wherein the DCDL calibration circuit comprises:
a second DCDL configured to generate a fourth clock signal by varying a phase of the second clock signal;
a third DCDL configured to generate a fifth clock signal by varying a phase of the fourth clock signal;
a bang-bang phase detector (BBPD) configured to detect a phase difference between the third clock signal and the fifth clock signal; and
a second controller configured to generate the gain signal for adjusting the gain of the first DCDL, based on the phase difference between the third clock signal and the fifth clock signal.

8. The frequency multiplier of claim 7, wherein the second controller is further configured to adjust the third clock signal and the fifth clock signal to be in phase with each other by:
varying a delay of the second DCDL to a minimum delay of the second DCDL,
detecting a phase offset between the third clock signal and the fourth clock signal, based on an output signal of the BBPD, and
varying a delay of the third DCDL, based on the phase offset.

9. The frequency multiplier of claim 7, wherein the second controller is further configured to adjust the third clock signal and the fifth clock signal to be in phase with each other by:
varying a delay of the second DCDL to a maximum delay of the second DCDL,
detecting the phase difference between the third clock signal and the fifth clock signal, based on an output signal of the BBPD, and
varying the gain of the first DCDL, based on the phase difference between the third clock signal and the fifth clock signal.

10. The frequency multiplier of claim 9, wherein the second controller is further configured to reduce the gain of the first DCDL when a phase of the fifth clock signal is greater than a phase of the third clock signal.

11. The frequency multiplier of claim 9, wherein the second controller is further configured to increase the gain of the first DCDL when a phase of the fifth clock signal is less than a phase of the third clock signal.

12. The frequency multiplier of claim 1, wherein the plurality of clock signals numbers the same as the different phases.

13. The frequency multiplier of claim 2, further comprising a multiplier,
wherein the first DCDL is further configured to use, as a digital control word (DCW), a most significant bit (MSB) of a result obtained by multiplication by the multiplier of an output signal of the first controller by an output signal of the DCDL calibration circuit.

14. A frequency multiplier comprising:
a first digitally controlled delay line (DCDL);
a multiplying delay-locked loop (MDLL) connected to an output terminal of the first DCDL;
a second DCDL connected to the output terminal of the first DCDL;
a third DCDL connected to an output terminal of the second DCDL;
a bang-bang phase detector (BBPD) connected to an output terminal of the MDLL and an output terminal of the third DCDL; and
a gain controller connected to an output terminal of the BBPD, the second DCDL, and the third DCDL, and configured to control a gain of the first DCDL.

15. The frequency multiplier of claim 14,
wherein the gain controller is further configured to adjust the gain of the first DCDL,
wherein a difference between a maximum delay and a minimum delay of the first DCDL is substantially equal to a period of an output signal of the MDLL.

16. The frequency multiplier of claim 14, further comprising:
a multiplier connected to the gain controller; and
a logic controller connected to the multiplier,
wherein the logic controller is configured to control a delay of the first DCDL and a frequency multiplication ratio of the MDLL.

17. The frequency multiplier of claim 16, wherein the logic controller is further configured to vary the delay of the first DCDL from the maximum delay of the first DCDL to a minimum delay of the first DCDL and decrement the frequency multiplication ratio of the MDLL when the delay of the first DCDL reaches a maximum delay of the first DCDL in an operation of increasing the delay of the first DCDL.

18. The frequency multiplier of claim 16, wherein the logic controller is further configured to vary the delay of the first DCDL from the minimum delay of the first DCDL to a maximum delay of the first DCDL and increment the frequency multiplication ratio of the MDLL when the delay of the first DCDL reaches a minimum delay of the first DCDL in an operation of reducing the delay of the first DCDL.

19. A frequency multiplier comprising:
- a first digitally controlled delay line (DCDL) configured to receive a first clock signal, and generate a second clock signal by varying a phase of the first clock signal, based on a digital control word (DCW) signal;
- a multiplying delay-locked loop (MDLL) configured to generate a third clock signal by multiplying a frequency of the second clock signal, based on the DCW signal;
- a DCDL calibration circuit configured to generate a gain signal for varying a gain of the first DCDL wherein a difference between a maximum delay and a minimum delay of the first DCDL is substantially equal to a period of the third clock signal;
- a controller configured to generate a logic signal for controlling a delay of the first DCDL and a frequency multiplication ratio of the MDLL; and
- a multiplier configured to generate the DCW signal by multiplying the gain signal and the logic signal.

20. The frequency multiplier of claim 19, wherein the controller is further configured to vary the delay of the first DCDL from the maximum delay of the first DCDL to the minimum delay of the first DCDL, and decrement the frequency multiplication ratio of the MDLL when the delay of the first DCDL reaches the maximum delay of the first DCDL in an operation of increasing the delay of the first DCDL.

* * * * *